United States Patent
Xu

(10) Patent No.: US 10,228,597 B2
(45) Date of Patent: Mar. 12, 2019

(54) TFT LIQUID CRYSTAL DISPLAY DEVICE

(71) Applicant: Shenzhen China Star Optoelectronics Technology Co., Ltd., Shenzhen, Guangdong (CN)

(72) Inventor: Liang Xu, Guangdong (CN)

(73) Assignee: SHENZHEN CHINA STAR OPTOELECTRONICS TECHNOLOGY CO., LTD., Shenzhen (CN)

(*) Notice: Subject to any disclaimer, the term of this patent is extended or adjusted under 35 U.S.C. 154(b) by 0 days.

(21) Appl. No.: 15/324,701

(22) PCT Filed: Dec. 14, 2016

(86) PCT No.: PCT/CN2016/109776
§ 371 (c)(1),
(2) Date: Jul. 7, 2017

(87) PCT Pub. No.: WO2018/036024
PCT Pub. Date: Mar. 1, 2018

(65) Prior Publication Data
US 2018/0180915 A1    Jun. 28, 2018

(30) Foreign Application Priority Data
Aug. 25, 2016   (CN) .......................... 2016 1 0724520

(51) Int. Cl.
*G02F 1/136*   (2006.01)
*G02F 1/1368*  (2006.01)
(Continued)

(52) U.S. Cl.
CPC .......... *G02F 1/1368* (2013.01); *G02F 1/1343* (2013.01); *G02F 1/1362* (2013.01);
(Continued)

(58) Field of Classification Search
CPC ..................................................... G02F 1/1368
See application file for complete search history.

(56) References Cited

U.S. PATENT DOCUMENTS

2003/0112400 A1   6/2003  Izumi et al.
2009/0135342 A1*  5/2009  Lee ................... G02F 1/134363
                                                                349/96
(Continued)

FOREIGN PATENT DOCUMENTS

CN    101726953    6/2010
CN    101840097    9/2010

OTHER PUBLICATIONS

Office Action from corresponding CN Patent Application No. 201610724520.6 dated Oct. 19, 2018 (5 pages) no translation.
(Continued)

*Primary Examiner* — James A Dudek

(57) ABSTRACT

Provided is a thin film transistor (TFT) liquid crystal display device, which is characterized in that an upper substrate is a substrate on which a series of TFT circuits are arranged, and a lower substrate is a thin film transistor TFT substrate. Common electrodes and pixel electrodes of the upper substrate and the lower substrate are alternately configured. The common electrode and pixel electrode of the upper substrate are respectively overlapped with the pixel electrode and common electrode of the lower substrate, so that positions of data lines and scanning lines of the upper substrate and positions of data lines and scanning lines of the lower substrate are overlapped. Thus, in an area corresponding to one scanning line and one data line originally, an original situation that only one pixel may be driven is changed into a situation that the upper and lower substrates both may drive one pixel, so that under the condition that resolutions
(Continued)

are the same, the area occupied by the scanning line and the data line is reduced, thereby improving the aperture ratio.

10 Claims, 4 Drawing Sheets

(51) Int. Cl.
    *G02F 1/1343*     (2006.01)
    *G02F 1/1362*     (2006.01)
    *H01L 27/12*     (2006.01)
    *H01L 29/786*     (2006.01)

(52) U.S. Cl.
    CPC .. *G02F 1/134309* (2013.01); *G02F 1/136286* (2013.01); *H01L 27/124* (2013.01); *H01L 27/1222* (2013.01); *H01L 27/1248* (2013.01); *H01L 29/78663* (2013.01); *H01L 29/78672* (2013.01); *G02F 2001/136222* (2013.01); *G02F 2201/121* (2013.01); *G02F 2201/123* (2013.01); *G02F 2201/40* (2013.01); *G02F 2202/103* (2013.01)

(56) References Cited

U.S. PATENT DOCUMENTS

| | | | |
|---|---|---|---|
| 2015/0279302 A1* | 10/2015 | Pai | G09G 3/3629 345/95 |
| 2018/0136528 A1 | 5/2018 | Xiao et al. | |
| 2018/0180915 A1 | 6/2018 | Xu | |

OTHER PUBLICATIONS

Search report from corresponding PCT Patent Application No. PCT/CN2016/109776 dated May 31, 2017 (14 pages) no translation.

* cited by examiner

TFT LIQUID CRYSTAL DISPLAY DEVICE

CROSS-REFERENCE TO RELATED APPLICATIONS

The present application claims the priority of Chinese patent application CN 201610724520.6, entitled "Thin film transistor liquid crystal display device" and filed on Aug. 25, 2016, the entirety of which is incorporated herein by reference.

FIELD OF THE INVENTION

The present disclosure relates to a liquid crystal display device, and specifically relates to a thin film transistor liquid crystal display device (TFT-LCD).

TECHNICAL BACKGROUND OF THE INVENTION

In 1888, Austrian botanist F: Reinitzer, found in the process of heating cholesteryl benzoate that the cholesteryl benzoate after being heated to 145.5 DEG C. was melted into white and turbid viscous liquid, and then the viscous liquid after continuing to be heated to 178.5 DEG C. was changed into an isotropic clear liquid. And the phenomenon was reversible. The phenomenon that a mesophase also existed between a solid state and a liquid state was told by F: Reinitzer to Professor OttoLehmann in Karlsruhe University. Professor OttoLehmann carried out detailed study on the lipid compound by using a polarizing microscope (with a heating device) which was up-to-date at that time and designed by Professor OttoLehmann. He found that many organic compounds including the cholesteryl benzoate respectively had a mesophase, and although the mesophase had a liquid appearance and had a characteristic of flowability, the mesophase showed a specific birefringence phenomenon of crystals. And because the mesophase had the dual properties of liquid and solid matters, Professor OttoLehmann named the mesophase Fliessende Krystalle, namely, liquid crystal. Most of matters in nature, because of being affected by temperature and pressure, are in the states of solid, liquid, and gas at normal temperatures and pressures. A solid matter has a fixed shape, with the distances between atoms or molecules constituting the solid matter and the sizes of the atoms or molecules themselves being almost equal, and the atoms or molecules being regularly arranged so as to form a crystal lattice. It may be viewed that each particle is fixed near some position to vibrate. Thus, the particles are arranged in a long-range order, and the physical properties of the solid matter are anisotropic. A liquid matter has no fixed shape, and the distance between particles constituting the liquid matter is slightly larger than the size of the particles themselves, so that the particles may move freely in the whole self-space of the liquid matter. Thus, the particles are arranged in a short-range order due to the presence of a 'crystal-like area,' and the physical properties of the liquid matter are isotropic. The distance between particles of a gas matter is much larger than the size of the particles, so that the particles may make a chaotic motion in a whole container. Thus, the physical properties of the gas matter are isotropic. The liquid crystal is a mesophase between a solid state and a liquid state, and concurrently has the characteristics of two kinds of matter phases which is determined by a microstructure in the liquid crystal. The composition molecules of the liquid crystal are anisotropic in geometrical shape. For example, some molecules are in the shape of a long rod, a flat disk, or a bowl. Thus, the physical properties of the liquid crystal are not only influenced by the positions of composition units, but also influenced by the orientations of the composition units. When crystals forming the liquid crystal are heated, the composition units of the liquid crystal firstly lose the characteristic of position ordering, but still have the characteristic of orientation ordering. Thus, the liquid crystal is still anisotropic liquid. If the liquid crystal continues to be heated, the molecules of the liquid crystal will lose the characteristic of orientation ordering, so that isotropic liquid is formed. This is the reason why a phenomenon that as if cholesteryl benzoate had two melting points occurred when cholesteryl benzoate was heated by F: Reinitzer. Researches on the liquid crystal after it was found had no news for a long time, during which, only a few scientists did some exploratory experiments in labs, and corresponding physical properties of the liquid crystal had certain framing accumulation till the 1930s. The change of a liquid crystal phase along with an electric field was researched firstly, and then in 1963, an electrooptical effect that a liquid crystal was produced under the action of an electric field was found. In 1968, a dynamic scattering effect was found, which marked the birth of liquid crystal display devices. In the following year, a greenhouse liquid crystal MBBA, because of having a characteristic of negative dielectric anisotropy, was immediately applied to a dynamic scattering type liquid crystal display device. Due to MOS-TFT and CMOS integrated circuits, transparent conducting thin films, button batteries, and the like occurring in the 1960s, liquid crystal display devices may be configured in compact-type electronic products and electronic devices. Therefore, in the 1970s, with the development of the information society, the demands of people on display devices grew. For meeting the demands, several panel display devices such as liquid crystal display (LCD) devices, plasma display panels (PDP), and OLED display devices were rapidly developed recently. In these panel display devices, liquid crystal display devices, because of having the advantages of low weight, small volume, and low energy consumption, had basically replaced cold cathode display devices.

A phase change effect of a cholesteric liquid crystal was found in 1969; a guest-host effect was found in 1974; and a cyanobiphenyl room-temperature liquid crystal (5CB and the like) found by Gray in the same year was very important for the development of liquid crystal display. A 5CB had a quite wide liquid crystal phase temperature, a stable performance, and large positive dielectric anisotropy, and birefringence, and thus may be applied to twisted nematic liquid crystal display found by Schadt and Helfrich in 1972, so that twisted nematic liquid crystals were rapidly and widely applied. Ferroelectric liquid crystal display occurred in 1980; super twisted nematic liquid crystal display occurred in 1984; and anti-ferroelectric liquid crystal display occurred in 1989. In the aspect of driving, the application of active matrix to drive liquid crystal display was put forward by Lechner in the United States in 1971. Hereby, the first LCD TV (Liquid Crystal Display Television) was manufactured by Hughes Company in 1973. Since 1990, a large amount of amorphous silicon TFT liquid crystal display devices were put into actual application, which showed that liquid crystal display devices came into a high-speed development period. Since 1996, LCD notebook computers were rapidly developed, and LCD mobile phones were rapidly popularized; and since 2000, desktop display devices were fully replaced with liquid crystal display devices. Liquid crystal display was not an important industrial field before the 1990s. The production of liquid crystal display was only $2 billion to $3 billion by 1996, and more than $50 billion by 2003. Liquid crystal display was greatly improved in the aspects of multi-line addressing capability, brightness, contrast ratio, response time, viewing angle, color coordinate, color and gray scale stability, and the like. Finally, in the third quarter of 2004, liquid crystal display exceeds traditional CRT display for the first time in the aspect of computer terminal display. In the aspect of liquid crystal device theories, after nearly 20 years of efforts of multiple research groups over the world, a continuous elastomer theory of liquid crystals was concluded by Frank in Britain in 1958. After Frederiks in Russia applied the continuous elastomer theory to three kinds of important liquid crystal distortions, the relationship between the distortion of liquid crystal orientation and an external electromagnetic field was explained well; Ericksen, Lesli, and Parodi proposed a liquid crystal dynamics and viscosity theory which successfully explained the relationship between liquid crystal orientation and flowability; and in addition, Alt and Pleshko proposed the optimal drive mode of LCD matrixes. These are well prepared for the design and higher-level development of liquid crystal display. According to literatures, liquid crystals were originally found in Europe, and the early theory development was also proposed in Europe. But liquid crystal display devices were born in the United States, and thin film transistor-liquid crystal display devices (TFT-LCD) most widely used currently also appeared for the first time in the United States. However, in the aspects of research, development, and production of liquid crystal display devices, the United States has fallen behind Japan and South Korea and other countries now. Asia is a key position for the development of liquid crystal display, and is a world leader in recent years. These Asian countries include Japan, South Korea, China, and Taiwan. In the past nearly 30 years, Japan occupied the absolute superiority in liquid crystal display devices. Ten years ago, Japan provided 90% of the output value of world's liquid crystal display devices. And now, Japan is still in the leading position in the overall environment of the liquid crystal display device industry. South Korea began to catch up 10 years ago, and with the heavy investment and strategic planning of the government, South Korea has ranked world first now in product technical index, yield and output value, and equipment advancement. The liquid crystal display device industry in China began to be built in the late 1970s, and was mostly concentrated in the south. In the 1990s, China already had the production capacity of super twisted liquid crystal display devices. A few years ago, the production of TFT liquid crystal display devices was also spread in China, and the country has began to invest in researches on high-grade LCD devices. In recent years, Japanese, South Korean, Taiwanese, and some European and American LCD device companies set up joint venture companies, sole-funded companies, or research and development centers in China, which further promotes the improvement of the production capacity of the LCD industry, the technological updating, and the expansion of market scale in China. A liquid crystal display device market research firm iSuppli=Stanford resouses talked that the rapid development process of the semiconductor industry in China over the past few years will appear again in the panel display industry, so that China will play an important role in the world panel display industry. It is universally acknowledged that China will be a big production country of the next generation of liquid crystal display devices.

But the TFT-LCD itself also begins to be challenged by new display technologies, such as organic light emitting diodes (OLED). This is mainly because the TFT-LCD itself also has some inherent shortcomings, and with the development of technology, these shortcomings will receive more and more challenges, and increasingly may not be accepted by consumers and the trend of technical development.

LCD related performance indexes include resolution, gray scale and chromatic number, brightness, contrast ratio, response speed and, viewing angle, as shown in FIG. 4. An LCD is divided into M (column)*N (row) units; each unit contains three sub-pixels, i.e., Red Green Blue (RGB), and the RGB sub-pixels correspond to a pixel; the resolution of the LCD is the product of M*N, as shown in FIG. 3; and the brightness is defined as the degree of lightness of a white picture of a display device, and the unit is 200 cd/m$^2$. The contrast ratio is defined as the ratio of pure white brightness to pure black brightness of a screen. The response speed refers to the time required for changing a pixel from bright to dark and then from dark to bright, and the unit is milliseconds. The response speed is divided into two parts: Rising and Falling; and at the time of expression, it will be subject to the sum of the two. The viewing angle refers to an included angle between the line of sight and a plane perpendicular to a screen when pictures with a contrast ratio of more than 10 may just be seen. The unit aperture ratio=light transmission area (A)/pixel area (B). Now, people have found at least more than 50,000 kinds of liquid crystal materials. Most of them are organic compounds, and a very few of them are inorganic compounds. Viewed from the compositions of the liquid crystal materials and the physical conditions of formation of liquid crystal phases, the liquid crystal materials may be divided into two major categories, i.e., thermotropic liquid crystals and lyotropic liquid crystals, wherein the thermotropic liquid crystal is a liquid crystal formed by melting some compound or mixture by heating and damaging a lattice structure due to the change of temperature; and the lyotropic liquid crystal is formed by dissolving one or more components in water or other solvents, and a liquid crystal phase will occur only after a certain concentration is reached. At present, materials for liquid crystal display are almost thermotropic liquid crystal materials, and the researches on the properties of lyotropic liquid crystal materials mainly focus on the aspects of biochemistry, biophysics, bionics, and the like. Molecules constituting a thermotropic liquid crystal are generally in the shape of a rod-like cigarette or flat plate. Liquid crystal phases of thermotropic liquid crystals including rod-like molecules are divided into three categories: smectic liquid crystals, nematic liquid crystals, and cholesteric liquid crystals.

The smectic liquid crystal is also known as a 'lamellar phase' which appears in a low temperature range, and is in the shape of smectic, and it is so named because its molecules constitute a lamellar structure layer by layer. The long axes of molecules in a layer are parallel to each other, perpendicular to the surface of the layer or have a certain angle with the surface of the layer. Because liquid crystal molecules carry out thermal motion and molecular interaction is implemented, the long axis orientations of the molecules are not completely parallel to some direction, but randomly changed by centering on an average orientation, and the average orientation is called 'director' by us. Mutual sliding may be implemented between the layers of liquid crystal molecules, but molecules in each layer may not mutually slide between the layers. Thus, the liquid crystal has liquidity, but is large in viscosity coefficient. The structure retains the orientation anisotropy of interactive forces of molecules, loses the translation ordering of crystal lattices, and has a two-dimensional ordering property. And the molecular arrangement uniformity of this structure is close to that of crystals. Due to the ordering, the viscosity of smectic liquid crystals is larger than the viscosity of nematic liquid crystals and the viscosity of cholesteric liquid crystals. In general case, liquid crystals which do not belong to nematic liquid crystals or cholesteric liquid crystals are categorized into smectic liquid crystals. Thus, the concept of the smectic liquid crystals is relatively vague.

The nematic liquid crystal as the main liquid crystal type of display currently contains rod-like molecules. Due to the molecular structure, the molecular arrangement mode of the nematic liquid crystal is as follows: the long axes are consistent in direction, and the center-of-gravity position is free. Due to the arrangement mode, the nematic liquid crystal is low in viscosity and strong in liquidity. Molecules of a smectic liquid crystal are also rod-like. The centers of gravity of the molecules are laminar, and the long axes of molecules are consistent in direction in each layer. But a certain angle is generally formed between the long axis of each molecule and the surface of the layer. Because the binding force of molecules in each layer is strong, the binding force of molecules among layers is weak. As a result, the smectic liquid crystal has two-dimensional liquidity, and the viscosity of the smectic liquid crystal is greater than that of the nematic liquid crystal. The liquid crystal has positive birefringence. Molecules of a cholesteric liquid crystal are not rod-like molecules. The molecular structure and arrangement of the cholesteric liquid crystal are also in a layered texture, but liquid crystals in each layer are arranged according to a nematic liquid crystal texture, with molecules in each layer being arranged in parallel on the surface of the layer. However, the cholesteric liquid crystal is characterized in that the directions of molecular axes among molecules between layers slightly have an angle, so that the overall texture of the liquid crystal forms a spiral structure. Due to the texture, the cholesteric liquid crystal has the special optical properties of obvious optical activity, selective light scattering, circular dichroism, and the like. Therefore, the cholesteric liquid crystal may be used as an additive for controlling the arrangement of liquid crystal molecules, and also may be directly used as a temperature color-changing liquid crystal.

The TFT-LCD has the following main features: 1) low specific gravity; 2) drug tolerance; 3) thermal stability: i, carrying out heat treatment (annealing) in advance in the process of glass preparation; and ii, increasing the lower limit of the deformation temperature of a glass substrate by using glass with a high transformation temperature; 4) flatness, warpage, waviness, and smoothness; 5) defect characteristics: surface defect and internal defects; 6) hardness: 400-550 kgf/mm$^2$; and 7) high temperature resistance: over 650 DEG C.

The main developing trend of the TFT-LCD is: 1, light weight and thinness; 2, low power consumption; 3, high aperture ratio technology; 4, high brightness (high transmittance) technology; 5, wide viewing angle technology; 6, high response speed; 7, large area; 8, high resolution; 9, flexible substrate; and 10, glasses-free 3D technology.

Compared with an OLED, the TFT-LCD mainly has the following problems.

The aperture ratio is low, which further reduces the utilization of energy; the rapid development of the TFT-LCD is associated with a situation that the TFT-LCD is more based on an amorphous silicon platform (of course, a small part of products are based on polycrystalline silicon), so that the TFT-LCD is low in price, simple in process, and good in uniformity. So, large-size products such as 55-inch and 65-inch products occur now. After the size is increased, the impedance of a circuit rises, so that metal wires which are broader, thicker, or better in electrical conductivity are required. Because the thickness cannot be indefinitely increased, and materials with the best electrical conductivity are metallic silver and copper, it is estimated that better practical conductive materials will not have a breakthrough for a long time. So only the line width may be increased, which further reduces the aperture ratio of the TFT-LCD.

Meanwhile, two kinds of display technologies are generally applied to television products: 1, IPS display mode; and 2, VA display mode.

In the VA display mode, if a usual 4Domain design is adopted, chromatic aberration will exist under different perspectives. Generally speaking, for VA products, a solution for improving the chromatic aberration is a designing solution of 8Domain (similar to 4Domain, but a sub-pixel has two Patterns similar to 4Domain). Of course, the details of the specific design may differ greatly, but are consistent in principle: the improvement of chromatic aberration is implemented by changing 4Domain into 8 Domains.

But for achieving 8Domain, some metal wirings or capacitors are required to be added, which will reduce the aperture ratios of pixels.

A usual liquid crystal display device is respectively provided with a gate wiring and a data wiring. The two wirings are orthogonally interlaced, and according to this wiring method, the gate wiring and the data wiring take up lots of space, and the two wirings are both metal wirings, which is not conducive to achieving a high aperture ratio (the aperture ratio refers to the ratio of an effective light transmission area to the total area).

As shown in FIG. 1, a usual liquid crystal display device is respectively provided with a gate wiring and a data line wiring, which are orthogonally interlaced. The wiring method is not conducive to the improvement of the aperture ratio of the display device.

SUMMARY OF THE INVENTION

The present disclosure aims to solve the technical problem of how to improve the aperture ratio under the condition that the resolution of a liquid crystal display device is not affected.

According to the present disclosure, TFT circuits are also arranged on a usual CF substrate. For distinguishing, the CF substrate is still called an upper substrate (CF substrate) in this text. In such a way, the upper substrate and a lower substrate respectively contain TFT circuits, so that gate wirings and data wirings of the upper substrate and the lower substrate may be completely overlapped, and no new space is required to be additionally occupied, thereby achieving an effect that the aperture ratio is increased and the resolution is not affected.

The technical solution of the present disclosure is specifically as follows.

The present disclosure provides a TFT liquid crystal display device, which includes an upper substrate, a lower substrate, pixel electrodes, and common electrodes, wherein the common electrode of the upper substrate and the pixel electrode of the lower substrate are overlapped and the pixel electrode of the upper substrate and the common electrode of the lower substrate are overlapped, so that positions of data lines and scanning lines of the upper substrate and positions of data lines and scanning lines of a pixel array of the lower substrate are overlapped;

wherein, in the upper substrate (CF substrate), data lines and scanning lines of an array, an RGB layer, and the pixel electrode are successively arranged, the common electrode and the pixel electrode being alternately configured among pixels; and in the lower substrate (TFT substrate), data lines and scanning lines of an array are arranged, wherein the positions of the data lines and the scanning lines of the lower substrate and the positions of the data lines and scanning lines of the upper substrate are overlapped (the two substrates are overlapped after being fit to each other), and then the pixel electrode is arranged, the pixel electrode and the common electrode being alternately configured among pixels.

Preferably, a TFT comprises a semiconductor thin film and an insulating layer in contact with one side surface of the semiconductor thin film.

Preferably, multiple layer bodies are arranged around a metal layer of the data line.

Preferably, the multiple layer bodies include a gate insulating layer, a semiconductor layer, an ohmic contact layer, a passivation layer, and a transparent conductive layer.

Preferably, the TFT is provided with a gate electrode, a source electrode, and a drain electrode.

Preferably, the semiconductor thin film of the TFT is one of amorphous silicon, polycrystalline silicon, and compound semiconductors, wherein the amorphous silicon TFT is of a laminated structure.

Preferably, the insulating layer in the amorphous silicon TFT includes silicon islands formed by silicon nitride.

Preferably, the CF color filter substrate has three colors, i.e., RGB (red, green, and blue); the RGB three primary colors of the CF substrate forms an arranged pattern, and the arranged pattern corresponds to sub-pixels of a TFT pixel on the TFT substrate one to one, wherein each pixel of RGB includes of three sub-pixels.

Preferably, the data lines of the upper substrate include a first data line and a second data line; and the scanning lines, i.e., gate lines, of the upper substrate include a first gate line and a second gate line.

Preferably, the RGB three primary colors of the upper substrate form an arranged pattern, which is specifically implemented as follows: after white light emitted from a backlight passes through the upper substrate, corresponding R light, G light, and B light are formed, and the R light, the G light, and the B light which are different in intensity are mixed together so as to achieve the effect of color display.

The TFT (thin film transistor) liquid crystal display device disclosed by the present disclosure has the beneficial effects.

According to the TFT-LCD provided by the present disclosure, in an area corresponding to one scanning line and one data line originally, an original situation that only one pixel may be driven is changed into a situation that the upper and lower substrates both may drive one pixel, so that under the condition that resolutions are the same, the area occupied by the scanning line and the data line is reduced, thereby improving the aperture ratio.

DETAILED DESCRIPTION OF THE EMBODIMENTS

Figure 5:
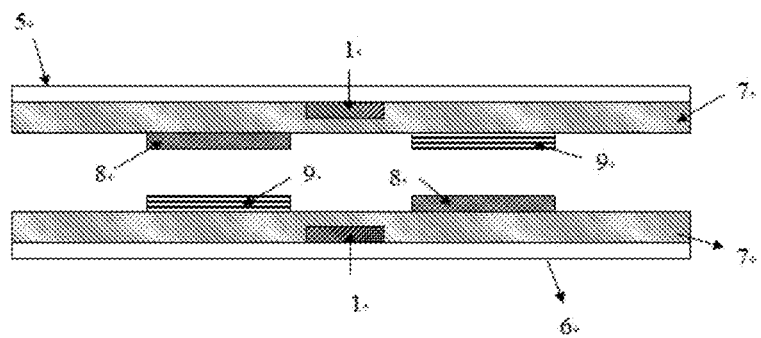
FIG. 5 is a simplified structure diagram of the TFT-LCD provided by the present disclosure, wherein 1 refers to data line, 7 refers to insulating layer, 8 refers to common electrode, 9 refers to pixel electrode, 5 refers to upper substrate, and 6 refers to lower substrate.

A TFT-LCD according to an embodiment of the present disclosure, as shown in FIG. 5, specifically includes: an upper substrate 5, a lower substrate 6, pixel electrodes 9, and common electrodes 8, wherein the common electrode 8 of the upper substrate 5 and the pixel electrode 9 of the lower substrate 6 are overlapped and the pixel electrode 9 of the upper substrate 5 and the common electrode 8 of the lower substrate 6 are overlapped, so that the positions of data lines 1 and scanning lines (gate lines) of the upper substrate 5 and the positions of data lines 1 and scanning lines (gate lines) of an array of the lower substrate 6 are overlapped.

Two array substrates are fit together, a lower array substrate being the lower substrate 6 controlling half of pixels, and an upper array substrate being the upper substrate 5 controlling half of pixels. The common electrodes and the pixel electrodes between the upper substrate 5 and the lower substrate 6 are alternately configured. The upper substrate 5 is an array substrate, and includes a color filter (CF) substrate on which a series of TFT circuits are arranged; and the lower substrate 6 is an array substrate including a thin film transistor TFT. The TFT refers to thin film transistor, which is an insulated gate field effect transistor made of a semiconductor thin film material. The pixel electrodes 9 include the pixel electrode 9 of the upper substrate 5 and the pixel electrode 9 of the lower substrate 6; and the common electrodes 8 include the common electrode 8 of the upper substrate 5 and the common electrode 8 of the lower substrate 6.

Figure 1:
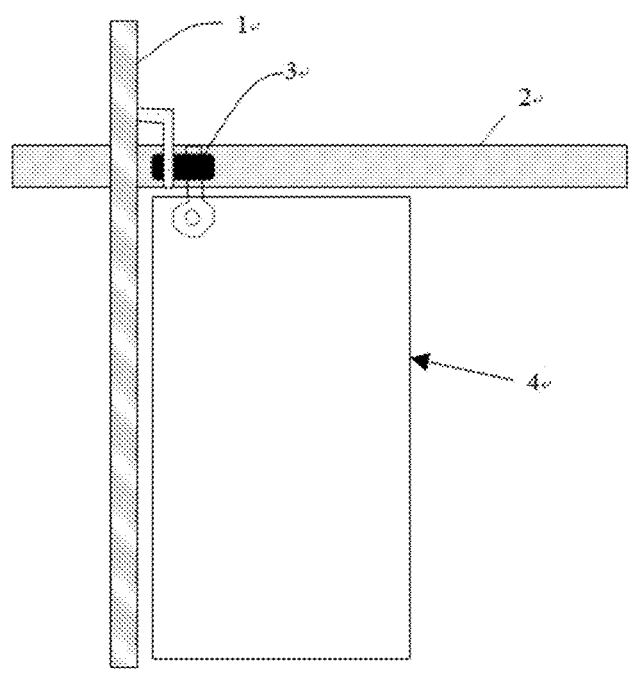
FIG. 1 is a schematic diagram of an orthogonal configuration of gate and data wirings adopted in a usual liquid crystal display device, wherein 1 refers to data line, 2 refers to gate line, 3 refers to silicon island, and 4 refers to pixel electrode.
Figure 2:
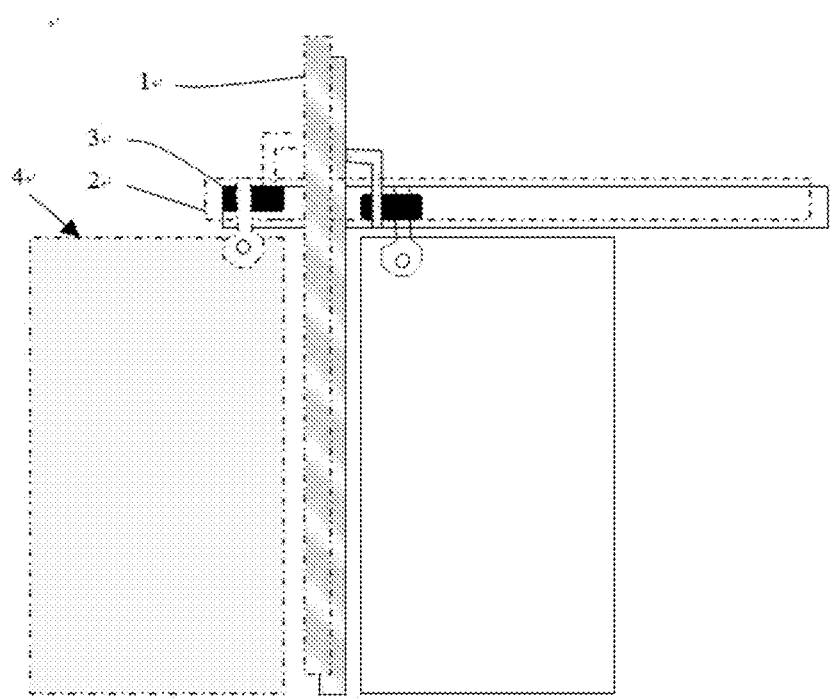
FIG. 2 is a diagram of the configuration of gate and data wirings of a TFT-LCD provided by the present disclosure, wherein dotted lines refer to wirings of an upper substrate, 1 refers to data line, 2 refers to gate line, 3 refers to silicon island, and 4 refers to pixel electrode.
Figure 3:
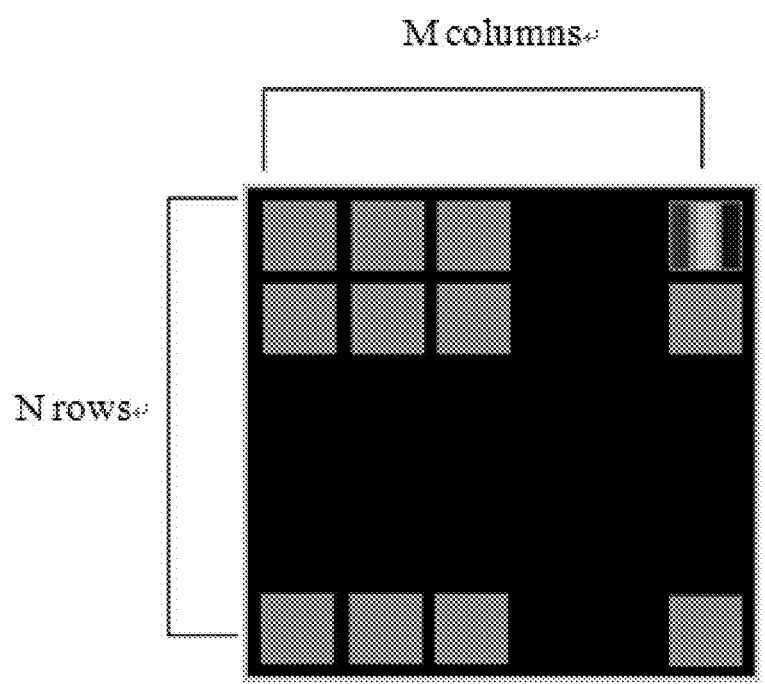
FIG. 3 is a diagram of resolution of an LCD in the prior art.
Figure 4:
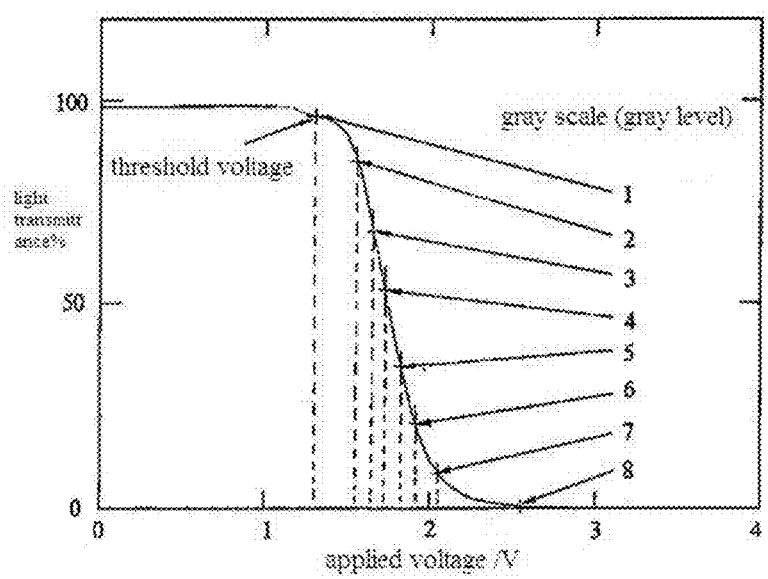
FIG. 4 is a diagram of gray scale and chromatic number in the prior art.

For clear expression, in FIG. 2, a part described by a dotted border line shows the wiring of the upper substrate, and a part described by a black solid border line shows the wiring of the lower substrate. For clear expression, the gate line and the data line are not completely overlapped, but deliberately staggered a bit for expressing clearly. In fact, the two lines are basically completely overlapped.

In the upper substrate (CF substrate), the data lines and scanning lines of an array, an RGB layer, and the pixel electrode are successively arranged, and the common electrode and the pixel electrode are alternately configured among pixels. In the lower substrate (TFT substrate), the data lines and scanning lines of an array are arranged, wherein the positions of the data lines and the scanning lines of the lower substrate and the positions of the data lines and scanning lines of the upper substrate are overlapped (the two substrates are overlapped after being fit to each other). Then the pixel electrode is arranged, and the pixel electrode and the common electrode are alternately configured among pixels. Further, the TFT usually includes a semiconductor thin film and an insulating layer in contact with one side surface of the semiconductor thin film.

Further, multiple layer bodies are arranged around a metal layer of the data line.

Further, the multiple layer bodies include a gate insulating layer, a semiconductor layer, an ohmic contact layer, a passivation layer, and a transparent conductive layer.

Further, the TFT is provided with a gate electrode, a source electrode, and a drain electrode.

Further, the semiconductor thin film of the TFT is one of amorphous silicon, polycrystalline silicon, and compound semiconductors, wherein an amorphous silicon TFT (a-Si-TFT) made of an amorphous silicon material, because of having a series of advantages of easy manufacturing, low costs of substrate glass, capability of satisfying the requirements of active matrix driving, large on/off current ratio, high reliability, easy large-scale production, and the like, has been widely applied, and becomes the mainstream technology in the TFT-LCD. The amorphous silicon TFT is of a laminated structure.

Further, the insulating layer in the amorphous silicon TFT usually includes silicon islands formed by silicon nitride. The silicon nitride is etched into independent silicon islands. A low-temperature polycrystalline silicon TFT facilitates the improvement of the effective display area and the improvement of the aperture ratio.

Further, the CF color filter substrate produces three colors, i.e., RGB (red, green, and blue). The RGB three primary colors of the upper substrate CF forms an arranged pattern, and the arranged pattern corresponds to sub-pixels of a TFT pixel on the TFT substrate one to one, wherein, each pixel of RGB includes three sub-pixels.

Further, the data lines of the upper substrate include a first data line and a second data line; and the scanning lines, i.e., gate lines, of the upper substrate include a first gate line and a second gate line.

Further, the RGB three primary colors of the upper substrate form an arranged pattern which is specifically implemented as follows. After white light emitted from a backlight passes through the upper substrate, corresponding R light, G light, and B light are formed. The R light, the G light, and the B light are displayed through the TFT, and the voltage exerted on each sub-pixel is adjusted, so that the transmitted intensity of each light is changed. The R light, the G light, and the B light which are different in intensity are mixed together so as to achieve the effect of color display.

Further, the gate wiring and data wiring of the lower substrate are completely overlapped, so that no new space is required to be additionally occupied, thereby achieving an effect that the aperture ratio is increased and the resolution is not affected.

Further, a half of the TFT circuits are arranged on the CF (color filter) substrate, and a half of the TFT circuits are arranged on the lower substrate.

Finally, it should be noted that the embodiments above are only adopted for illustrating the technical solution of the present disclosure, and not intended to limit the present disclosure, although the present disclosure is described in detail with reference to better embodiments. Persons of ordinary skill in the art may understand that any modification and equivalent replacement on the technical solution of the present disclosure without departing from the aim and scope of the technical solution of the present disclosure should fall within the scope of claims of the present disclosure.

The invention claimed is:

1. A thin film transistor (TFT) liquid crystal display device, comprising an upper substrate, a lower substrate, pixel electrodes, and common electrodes, wherein the common electrode of the upper substrate and the pixel electrode of the lower substrate are overlapped and the pixel electrode of the upper substrate and the common electrode of the lower substrate are overlapped, so that positions of data lines and scanning lines of the upper substrate and positions of data lines and scanning lines of a pixel array of the lower substrate are overlapped, wherein TFT circuits are arranged on the upper substrate, and on the lower substrate, wherein in the upper substrate, the data lines and scanning lines of an array, an RGB layer, and the pixel electrode are successively arranged, with the common electrode and the pixel electrode being alternately configured among pixels, wherein in the lower substrate, the data lines and scanning lines of an array, and the pixel electrode are successively arranged, with the pixel electrode and the common electrode being alternately configured among pixels, and wherein when the upper and lower substrates are fit together, the positions of the data lines and scanning lines of the upper substrate and the positions of the data lines and scanning lines of the lower substrate are substantially overlapped along their lengths.

2. The TFT liquid crystal display device according to claim 1, wherein the TFT comprises a semiconductor thin film and an insulating layer in contact with one side surface of the semiconductor thin film.

3. The TFT liquid crystal display device according to claim 1, wherein multiple layer bodies are arranged around a metal layer of the data line.

4. The TFT liquid crystal display device according to claim 1, wherein the multiple layer bodies include a gate insulating layer, a semiconductor layer, an ohmic contact layer, a passivation layer, and a transparent conductive layer.

5. The TFT liquid crystal display device according to claim 2, wherein the TFT is provided with a gate electrode, a source electrode, and a drain electrode.

6. The TFT liquid crystal display device according to claim 3, wherein the semiconductor thin film of the TFT is one of amorphous silicon, polycrystalline silicon, and compound semiconductors, wherein the amorphous silicon TFT is of a laminated structure.

7. The TFT liquid crystal display device according to claim 6, wherein the insulating layer in the amorphous silicon TFT includes silicon islands formed by silicon nitride.

8. The TFT liquid crystal display device according to claim 7, wherein the CF color filter substrate produces three colors, i.e., RGB (red, green, and blue);

wherein the RGB three primary colors of the CF substrate form an arranged pattern, which corresponds to sub-pixels of a TFT pixel on the TFT substrate one to one; and wherein, each pixel of RGB includes three sub-pixels.

9. The TFT liquid crystal display device according to claim 8, wherein the data lines of the upper substrate include a first data line and a second data line; and wherein the scanning lines, i.e., gate lines, of the upper substrate include a first gate line and a second gate line.

10. The TFT liquid crystal display device according to claim 9, wherein the RGB three primary colors of the upper substrate form an arranged pattern which is specifically implemented as follows: after white light emitted from a backlight passes through the upper substrate, corresponding red light, green light, and blue light are formed, and the red light, the green light, and the blue light which are different in intensity are mixed together so as to achieve the effect of color display.

* * * * *